(12) United States Patent
Bailey, III et al.

(10) Patent No.: US 8,414,790 B2
(45) Date of Patent: Apr. 9, 2013

(54) BEVEL PLASMA TREATMENT TO ENHANCE WET EDGE CLEAN

(75) Inventors: Andrew D. Bailey, III, Pleasanton, CA (US); Yunsang Kim, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 268 days.

(21) Appl. No.: 12/774,712

(22) Filed: May 5, 2010

(65) Prior Publication Data

US 2010/0213173 A1 Aug. 26, 2010

Related U.S. Application Data

(63) Continuation of application No. PCT/US2008/012842, filed on Nov. 13, 2008.

(51) Int. Cl.
*C03C 15/00* (2006.01)

(52) U.S. Cl. ........ 216/100; 438/475; 438/477; 438/513; 438/754; 438/690; 134/148

(58) Field of Classification Search .................. 216/100; 438/475, 477, 513, 754, 690, 780, 798; 134/148
See application file for complete search history.

(56) References Cited

U.S. PATENT DOCUMENTS

| | | | |
|---|---|---|---|
| 6,261,407 B1 * | 7/2001 | Treichel et al. ............ | 156/345.3 |
| 6,333,257 B1 | 12/2001 | Aoi ............................. | 438/626 |
| 6,333,275 B1 | 12/2001 | Mayer et al. | |
| 6,833,063 B2 * | 12/2004 | Basol ............................ | 205/668 |
| 7,256,148 B2 * | 8/2007 | Kastenmeier et al. ........ | 438/798 |
| 7,909,960 B2 * | 3/2011 | Kim et al. .................. | 156/345.3 |
| 2003/0141201 A1 * | 7/2003 | Basol ............................ | 205/668 |
| 2005/0247667 A1 | 11/2005 | Kim et al. | |
| 2006/0128152 A1 | 6/2006 | Kim et al. ..................... | 438/690 |
| 2006/0172538 A1 | 8/2006 | Itzkowitz et al. | |
| 2007/0068900 A1 | 3/2007 | Kim et al. | |

* cited by examiner

*Primary Examiner* — Lan Vinh
*Assistant Examiner* — Maki Angadi
(74) *Attorney, Agent, or Firm* — Martine Penilla Group, LLP (57) ABSTRACT

The various embodiments described in the specification provide improved mechanisms of removal of unwanted deposits on the bevel edge to improve process yield. The embodiments provide apparatus and methods of treating the bevel edge of a copper plated substrate to convert the copper at the bevel edge to a copper compound that can be wet etched with a fluid at a high etch selectivity in comparison to copper. In one embodiment, the wet etch of the copper compound at high selectivity to copper allows the removal of the non-volatile copper at substrate bevel edge in a wet etch processing chamber. The plasma treatment at bevel edge allows the copper at bevel edge to be removed at precise spatial control to about 2 mm or below, such as about 1 mm, about 0.5 mm or about 0.25 mm, to the very edge of substrate. In addition, the apparatus and methods described above for bevel edge copper removal do not have the problems of copper etching fluid being splashed on the device regions to cause defects and thinning of copper films. Therefore, device yield can be greatly improved.

14 Claims, 6 Drawing Sheets

BEVEL PLASMA TREATMENT TO ENHANCE WET EDGE CLEAN

This application claims priority under 35 U.S.C. §§120 and 365(c) as a continuation application of prior International Application PCT/US2008/012842, which was filed on Nov. 13, 2008, and which was published in English under PCT Article 21(2). The disclosure of the prior international application is incorporated herein by reference.

FIELD OF INVENTION

The present invention relates in general to substrate manufacturing technologies and in particular to apparatus and methods for using plasma exposure to convert a film, such as copper, at bevel edge into a liquid soluble material. The converted film at bevel edge is then removed by a wet etch chemistry with high etch selectivity.

BACKGROUND

In the processing of a substrate, e.g., a semiconductor substrate (or wafer) or a glass panel such as one used in flat panel display manufacturing, plasma is often employed. During substrate processing, the substrate (or wafer) is divided into a plurality of dies, or rectangular areas. Each of the plurality of dies will become an integrated circuit. The substrate is then processed in a series of steps in which materials are selectively removed (or etched) and deposited.

Copper is becoming the conductor of choice for device interconnects for many integrated circuit manufacturers due to its lower resistivity, better electromigration and stress-void resistance than aluminum. One method of forming a copper interconnect structure employs an electroplating process. In a typical copper electroplating process, a barrier layer of tantalum (Ta) and/or tantalum nitride (TaN) is first deposited over the substrate. Next, a copper seed layer is formed over the barrier layer. Copper seed layer can be deposited by a variety of techniques, including chemical vapor deposition (CVD) and physical vapor deposition (PVD). The substrate is then placed in a bath of an electrolyte plating solution to deposit a copper layer, which is sometimes gap-fill layer, over the copper seed layer.

After plating is completed, the substrate is typically transferred to a rinsing station where a solution including de-ionized water is applied to remove and neutralize any excess or remaining plating solution on the substrate. During the plating process, unwanted copper plating may occur on the bevel edge and/or backside of the substrate, which would become sources of particles. Removal of unwanted copper plating on the substrate backside is relatively straightforward. However, removal of unwanted copper plating on the bevel edge is more challenging.

In view of the foregoing, there is a need for apparatus and methods that provide improved mechanisms of removal of unwanted deposits on the bevel edge to improve process yield.

SUMMARY

Broadly speaking, the embodiments fill the need by providing improved mechanisms of removal of unwanted deposits on the bevel edge to improve process yield. The embodiments described above provide apparatus and methods of treating the bevel edge of a copper plated substrate to convert the copper at the bevel edge to a copper compound that can be wet etched with a fluid at a high etch selectivity in comparison to copper. Alternatively, the copper compound can be etched in a dedicated bevel edge plasma etching chamber. Either wet etch or dry etch of the copper compound allows the removal of the non-volatile copper in a wet etch processing chamber or a dedicated dry etching plasma chamber. The plasma treatment at bevel edge allows the copper at bevel edge to be removed at precise spatial control to about 2 mm or below, such as about 1 mm, about 0.5 mm or about 0.25 mm, to the very edge of the substrate. In addition, the apparatus and methods described above for bevel edge copper removal do not have the problems of copper etching fluid being splashed on the device regions to cause defects and thinning of copper films. Therefore, device yield can be greatly improved.

It should be appreciated that the present invention can be implemented in numerous ways, including as a process, an apparatus, or a system. Several inventive embodiments of the present invention are described below.

In one embodiment, a method of treating a copper film on a bevel edge of a substrate to covert the copper film to a copper compound to be removed by a wet etch is provided. The method includes placing the substrate on a substrate support in the plasma treatment chamber. The method also includes flowing a treatment gas through a gas feed located embedded in a gas distribution plate, disposed at a distance from the substrate support. The method further includes generating a treatment plasma near the bevel edge of the substrate to convert the copper film on the bevel edge of the substrate to a copper compound. The generated treatment plasma converts copper film is less than about 2 mm from a very edge of the substrate to the copper compound. In addition, the method includes placing the substrate in a wet etching apparatus with a wet etching fluid to remove the copper compound on the bevel edge.

In another embodiment, a method of treating a copper film on a bevel edge of a substrate to covert the copper film to a copper compound to be removed by a wet etch is provided. The method includes removing the copper film on a backside of the substrate, and placing the substrate on a substrate support in the plasma treatment chamber, after the copper film on the backside of the substrate is removed. The method also includes flowing a treatment gas through a gas feed located embedded in a gas distribution plate, disposed at a distance from the substrate support. The method further includes generating a treatment plasma near the bevel edge of the substrate to convert the copper film on the bevel edge of the substrate to a copper compound. The generated treatment plasma converts copper film is less than about 2 mm from a very edge of the substrate to the copper compound. In addition, the method includes placing the substrate in a wet etching apparatus with a wet etching fluid to remove the copper compound on the bevel edge. The copper compound on the bevel edge is etched by the wet etching fluid at a wet etch selectivity greater than about 20:1 to the copper film away from the bevel edge.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE EXEMPLARY EMBODIMENTS

Several exemplary embodiments for improved mechanisms to remove undesirable deposits on the bevel edges of wafers to improve process yield are provided. It will be apparent to those skilled in the art that the present invention may be practiced without some or all of the specific details set forth herein.

Figure 1A:
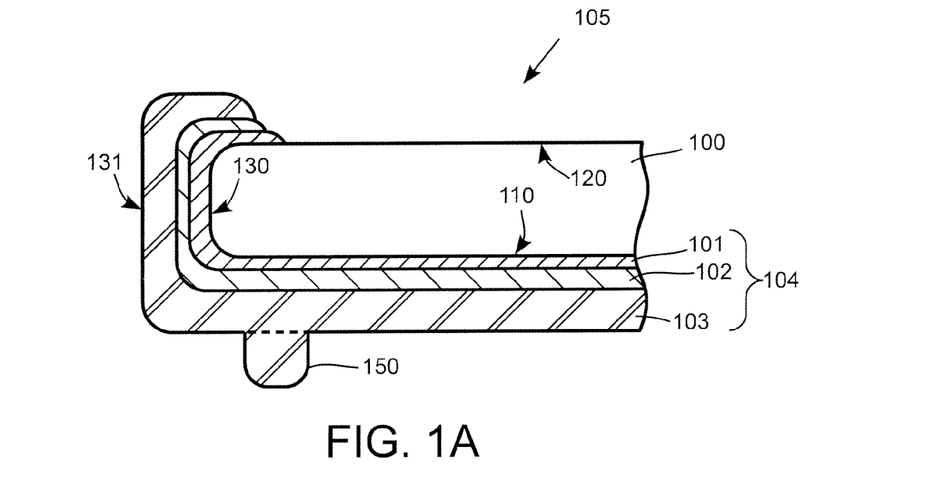
FIG. 1A shows a cross-sectional view of a copper plated substrate, in accordance with one embodiment of the present invention

FIG. 1A shows a cross-sectional view of a copper-plated substrate 105 that has a substrate body 100 with a front side 110, a backside 120 and a very edge 130 between the front and backsides, in accordance with one embodiment of the present invention. Substrate body 100 could be a wafer without other films and features. Substrate body 100 could also have various films and features from prior processing. The substrate 105 of FIG. 1A is held upside down, with the substrate front side 110 facing downward. In FIG. 1A, there is a barrier layer 101, such as tantalum (Ta) and/or tantalum nitride (TaN) covering the substrate front side 110 and the very edge 130. In one embodiment, the thickness of the Ta, TaN, or Ta/TaN barrier layer is less than 150 Å. The barrier layer 101 covers the substrate front side, and the bevel edge and sometimes part of the substrate backside.

Over the barrier layer 101, there is a copper seed layer 102, which is needed to initiate nucleation sites during copper plating. The copper seed layer 102 can be deposited by chemical vapor deposition (CVD) or by physical vapor deposition (PVD). The copper seed layer 102 shown in the embodiment in FIG. 1A is deposited by PVD and covers the substrate front side, and the bevel edge and sometimes part of the substrate backside. In one embodiment, the thickness of the copper seed layer can be less than 2000 Å, and preferably less than 1000 Å. Over the copper seed layer 102, there is a copper layer 103 deposited by a plating process, such as electro-chemical plating (ECP). The thickness of the copper layer is between about 500 Å to about 8000 Å.

During the plating process, the copper layer 103 is formed over seed layer 102. Copper layer 103 forms mainly on portions of the substrate covered by copper seed layer 102. After copper layer 103 is formed, there are copper surface 131 covering the very edge 130 of substrate and copper surface 111 covering the front side of substrate 100.

During the plating process, unwanted copper plating may occur on the edge and/or backside of the substrate. The extent of such unwanted plating depends in part on the formation of the seed layer. In addition, some copper plating processes use a shadow mask or similar technique during deposition of the seed layer to exclude deposition from an outermost periphery, e.g., the outer 2 mm, of the substrate. The example shown in FIG. 1A does not use a shadow mask during deposition of the seed layer.

In one embodiment, an excess build-up of copper plating, shown as an edge bead 150, forms at the edge of layer 103. Edge bead 150 could result from locally higher current densities at the edge of seed layer 102 and usually forms within 2-5 mm of very edge 130. The extra thickness of the edge bead 150 is undesirable, since the surface of substrate 105 is not flat due to the edge bead. In addition, the edge bead 150 can detach during following processing to cause particle issue. Layers 101, 102, and 103 forms a composite 104 layer.

Copper deposited on the bevel edge and substrate backside is undesirable. Devices cannot be formed on the very end of bevel edge and substrate backside. Copper film deposited in these areas can cause particle problem during subsequent processing. In addition, the copper deposited in these areas can contaminate process chambers that are used to process the substrate. The copper in the copper-contaminated process chamber(s) could be deposited or fall on other substrates that are processed in the copper-contaminated process chamber(s) and could diffuse into device area to make devices inoperable.

Further, copper is a non-volatile metal and cannot be removed by a dry-etching process. If unwanted copper at bevel edge and substrate backside is etched during plasma processing, the copper will stay in the process chamber. To remove the copper buildup, the chamber will need to be shut down to be wet cleaned, e.g. manually. The termination of continuous processing due to wet clean can significantly impact the manufacturing throughput. Therefore, it's important to remove the unwanted copper at bevel edge and at substrate backside before next plasma processing.

After substrate 105 is plated with copper layer 103, substrate 105 undergoes process steps to neutralize and to remove any of the copper electrolyte solution remaining from the plating step in one or more process chambers. After the copper electrolyte solution has been removed from substrate 105, a backside cleaning process follows to remove the copper film deposited on backside 120 of substrate 105 and the very edge 130.

Figure 1B:
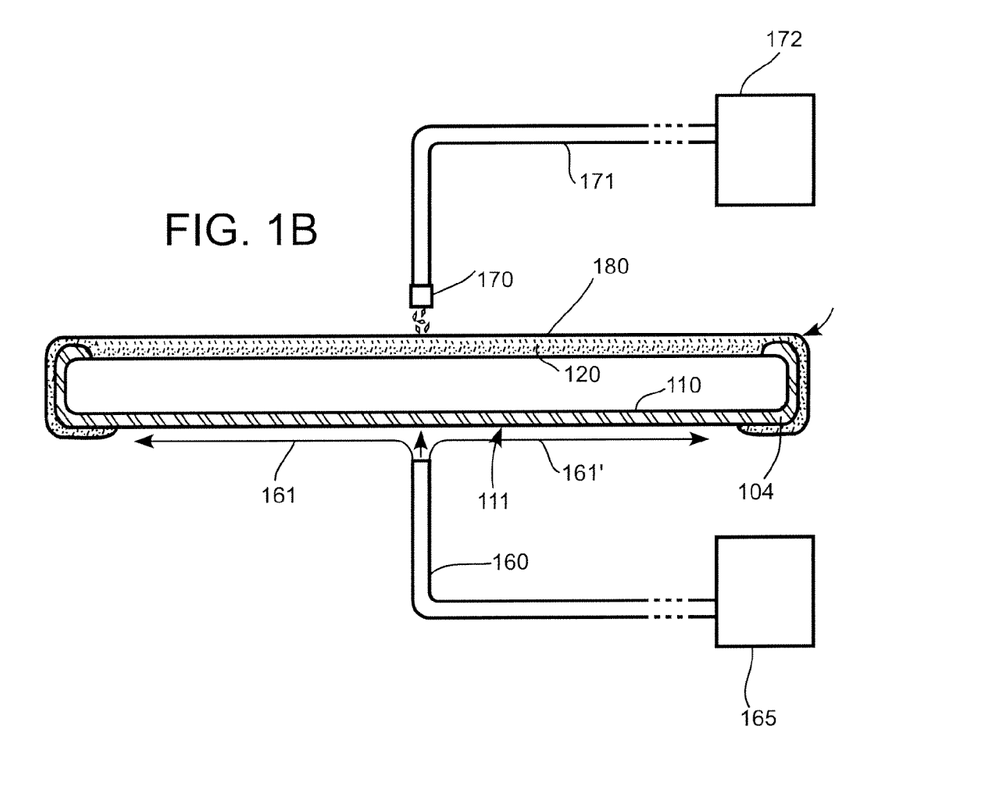
FIG. 1B shows an apparatus for removing the unwanted copper from substrate backside and bevel edge, in accordance with one embodiment of the present invention.

FIG. 1B shows an apparatus 155 for removing the unwanted copper from substrate backside and bevel edge, in accordance with one embodiment of the present invention. Substrate 105 is held horizontally by a substrate holder (not shown) facing down. As the substrate is spun, a flow of an inert gas, such as molecular nitrogen ($N_2$), helium (He), or argon (Ar), is introduced to the front side of substrate 105 through a fluid channel 160. The fluid channel 160 is coupled to a gas tank 165, which stores the inert gas being applied to the front side of substrate 105. A copper-etching fluid is introduced to the backside 120 of the substrate 105 from a dispenser 170. The dispenser 170 is coupled to a liquid channel 171, which is coupled to a tank 172 storing the copper-etching fluid. In one embodiment, the copper-etching fluid is sulfuric acid. In another embodiment the copper-etching fluid is a mixture of sulfuric acid and hydrogen peroxide. In other embodiments, nitric acid, citric acid or similar cleaning fluids may be used.

Figure 1C:
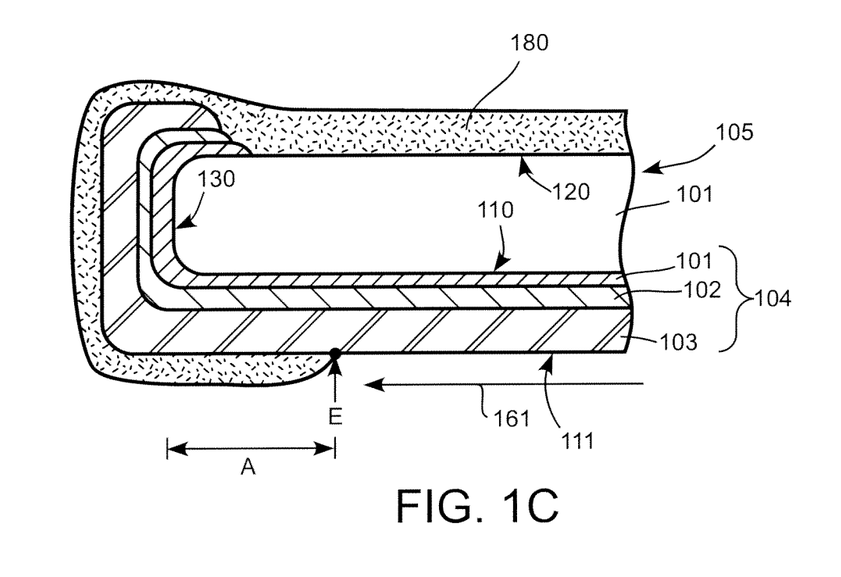
FIG. 1C shows the cross section of a portion of a copper plated substrate after the copper-etching fluid spread from the substrate backside to cover the bevel edge, and a portion of substrate front side, in accordance with one embodiment of the present invention.

The copper-etching fluid spreads across the backside surface 120 of substrate 105 to cover the copper surface 131 over bevel edge and a portion of the front side 111 of substrate 105. The spread cleaning fluid forms a thin film 180 over the substrate backside 120, the copper surface over bevel edge 131, and a portion of substrate front side 111, as shown in FIG. 1B. FIG. 1C shows the cross section of a portion of the copper plated substrate 105 after the copper-etching fluid spread from the substrate backside 120 to cover the bevel edge, and a portion of substrate front side, in accordance with one embodiment of the present invention. The distance from the leading edge of the copper-etching fluid to the very edge of substrate body 100 is distance "A". The leading edge of the copper-etching fluid is suspended at the substrate front side 111 at location "E" by the inert gas flow 161.

The process described above uses the flow of inert gas to prevent copper cleaning fluid at a certain distance, such as distance A, from the bevel edge. For advanced technologies, it is desirable to expand the usable areas on the substrate surface to the very edge of wafer. Typically, the target is to have usable area expended to about 2 mm from the bevel edge (e.g. "A" ~2 mm), preferably to about 1 mm from the bevel edge. For future technologies, the usable area can be pushed to about 0.5 mm, or even less than 0.5 mm, from the bevel edge.

However, the spatial control of the method and apparatus of removing the unwanted copper from substrate backside and bevel edge described above is not very consistent or precise. It's hard to consistently maintain the distance "A" to about 2 mm. Also, the copper-etching fluid sometimes does not completely remove the copper at the bevel edge. Further, the copper-etching fluid often splashes on the other parts of the front side surface 111 to cause defects, spots and different copper thickness in the main device area.

Figure 1D:
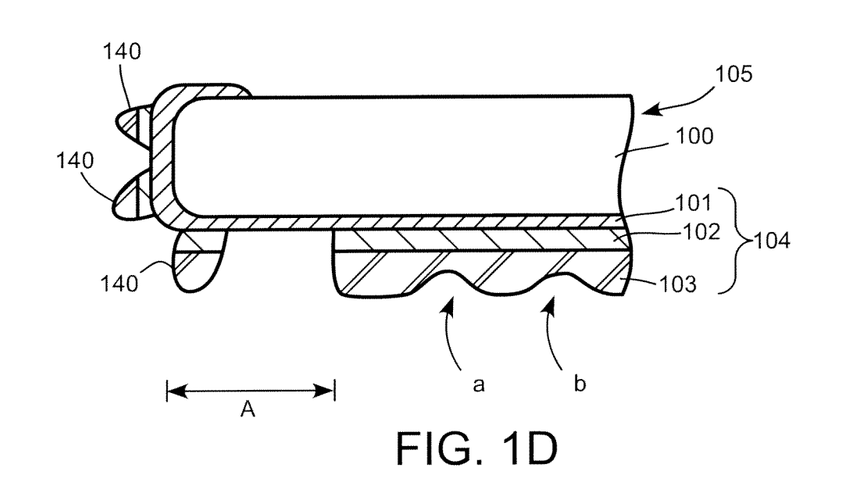
FIG. 1D shows a copper plated substrate after the processing step of removing unwanted copper on the backside and bevel edge, in accordance with one embodiment of the present invention.

FIG. 1D shows the substrate 105 after the processing step of removing unwanted copper on the backside and bevel edge, in accordance with one embodiment of the present invention. As shown in FIG. 1D some copper islands 110 are ledge on the bevel edge. The distance "A" varies from substrate to substrate. In addition, splashing of the copper-etching fluid leaves some areas, such as areas a, and b with thinner copper thickness.

For advanced technology that pushes the usable area to 1 mm or less from the substrate edge, the process described above is not precise enough to produce usable area out to 1 mm or less from the substrate edge with a precision control equal to or less than about +/−0.1 mm.

Figure 2A:
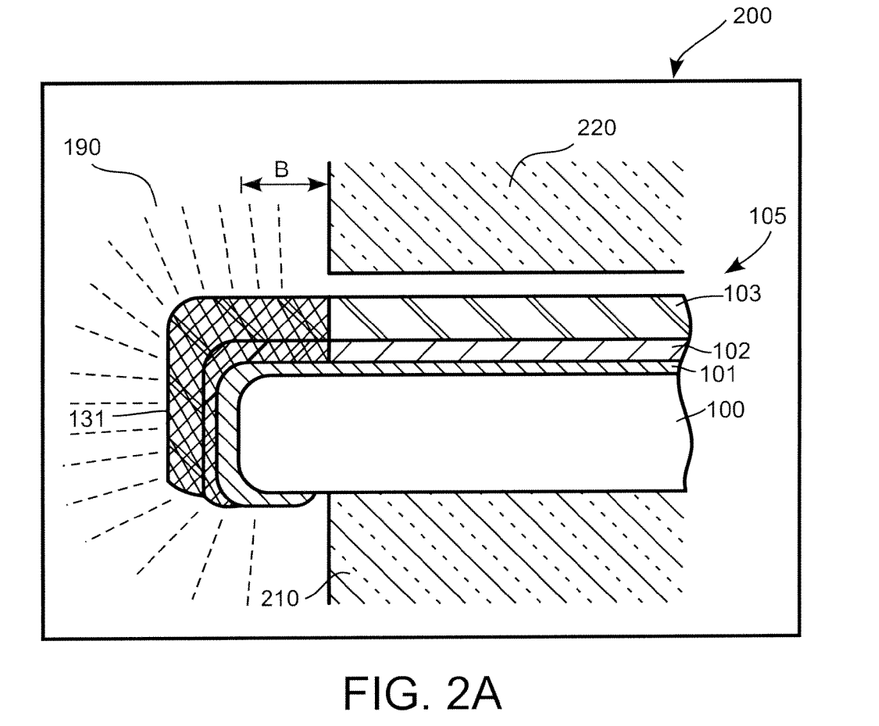
FIG. 2A shows a cross section of a copper plated substrate being exposed to a plasma near bevel edge, in accordance with one embodiment of the present invention.

FIG. 2A shows a cross section of substrate 105' being exposed to a plasma 190 near bevel edge, in accordance with one embodiment of the present invention. Substrate 105' has gone through backside wet etch to remove copper in the backside, for example using a process described above in FIG. 1B. However, the wet etch to remove copper removes mostly the copper on the substrate backside. The copper on the bevel edge is not targeted to be removed. Therefore, the copper is only either on the side of the bevel edge or on top of the substrate, as shown in FIG. 2A. Substrate 105' is disposed, facing up, on a substrate support 210 in a plasma chamber 200. The center portion of top surface 111 of substrate 105' is covered by a plasma shield 220. The exposed bevel edge is at a distance "B" to very edge 130. The copper surface 131' at the very edge 130 is exposed to the plasma 190 and is converted to a copper compound, such as $CuO_E$, $CuO_XF_Y$, or $CuO_CCl_D$, by plasma 190. E, X, Y, C, and D are numbers. The copper compound can be wet etched by an etching liquid, such as a liquid containing ammonium citrate, with a high etch selectivity to Cu. Other examples of etching liquid include HF, HCl, and citric acid.

Distance "B" is the edge exclusion the integrated process attempts to achieve. For example, if the integrated process has an edge exclusion requirement of 1 mm. Distance "B" is about 1 mm. Since distance "B" is controlled by mechanical hardware, distance "B" can be repeatable and consistent.

Figure 2B:
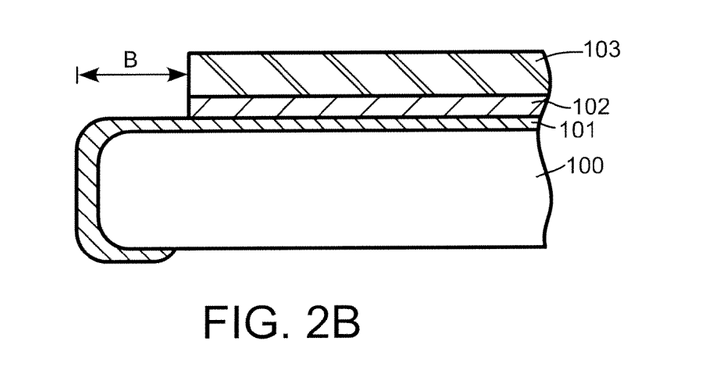
FIG. 2B shows a copper plated substrate after it goes through the wet etch to remove copper compound at bevel edge, in accordance with one embodiment of the present invention.

FIG. 2B shows the substrate 105' after it goes through the wet etch to remove copper compound, such as $CuO_E$, $CuO_XF_Y$, or $CuO_CCl_D$, in accordance with one embodiment of the present invention. Only the copper film on the front side of the substrate that has not been converted to copper compound, such as $CuO_E$, $CuO_XF_Y$, or $CuO_CCl_D$ remains on the substrate. The converted $CuO_E$, $CuO_XF_Y$, or $CuO_CCl_D$ film on the bevel edge has been edge by the wet etch chemistry. Due to the high selectivity of the etching fluid, such as ammonium citrate, on copper compound versus copper, the substrate surface can be in contact with the etching fluid for sufficient time to remove all copper compound without leaving unetched islands behind. In one embodiment, the wet etch selectivity is greater than about 20, which means that the ratio of wet etch rate of material to wet etch rate of copper is about 20. In anther embodiment, the wet etch selectivity is between about 50 to about 100.

By using a plasma to convert bevel edge copper film to a copper compound, such as $CuO_E$, $CuO_XF_Y$, or $CuO_CCl_D$, the spatial control is greatly improved. Spatial control to about 1 mm, or less, becomes possible. Also, the problem of unetched islands disappears. Further, since the copper removal at the previous step is mainly on the substrate backside, the copper-etching fluid is much less likely to splash on the front side of substrate to cause defects and thinning of copper in device regions.

As shown in FIG. 2B, the barrier layer 101 is left on the substrate 105. The barrier layer 101 can be wet etched or be etched in a plasma chamber. Barrier layer 101 is typically made with materials, such as Ta and/or TaN, that is volatile; therefore, can be dry-etched in a plasma chamber.

Figure 3:
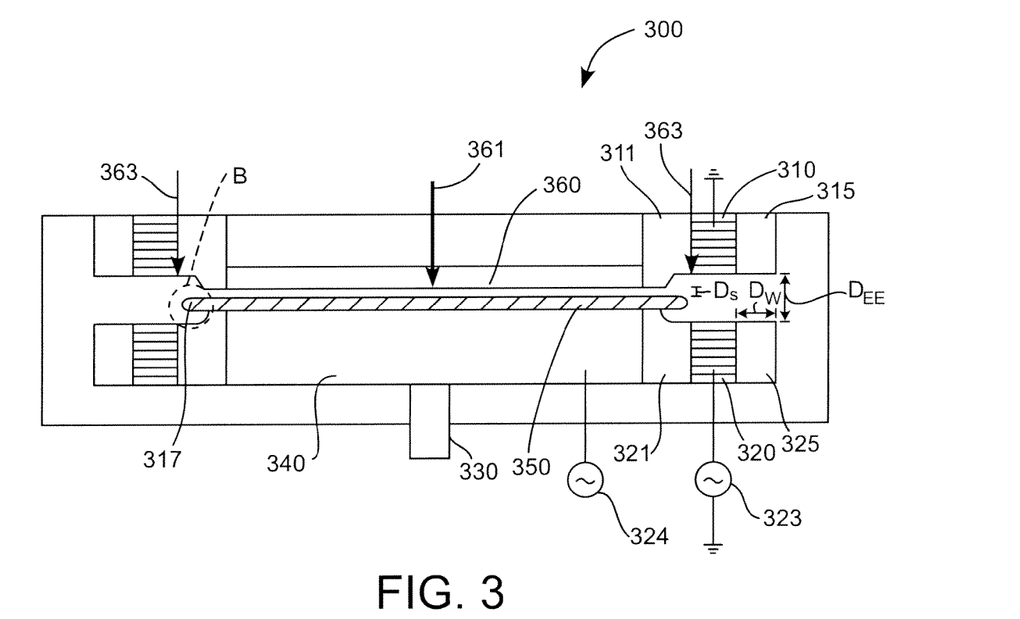
FIG. 3 shows a cross-sectional view of a plasma system configured to generate a bevel edge plasma, in accordance with one embodiment of the present invention.
Figure 3A:
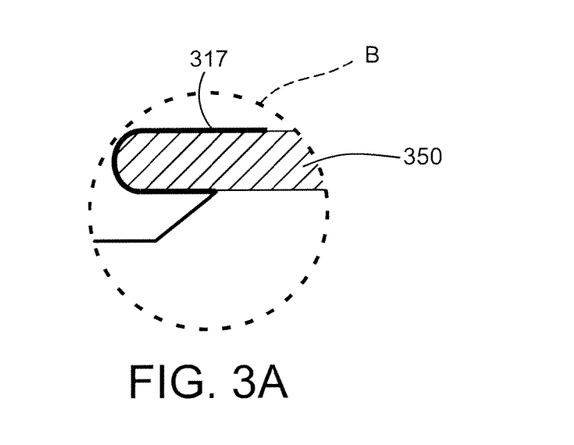
FIG. 3A shows a cross sectional view of an enlarged region B with bevel edge of FIG. 3, in accordance with one embodiment of the present invention.

FIG. 3 shows an embodiment of a plasma processing process chamber 300 for performing plasma treatment near the bevel edge of the substrate. Chamber 300 has a substrate support 340 with a substrate 350 on top. In one embodiment, the substrate support 340 is an electrostatic chuck, which is powered by a RF (radio frequency) power source (not shown). In another embodiment, the substrate support 340 is a regular electrode. The substrate support 340 can be DC (direct current) or RF biased. Opposing the substrate support 340 is a gas delivery plate 360 with a center gas feed 361. Alternatively, the gas delivery plate 360 has edge gas feeds 363, which supply gas to the bevel edge of substrate 350. The substrate support can also be RF powered, biased, or grounded. During etching of substrate 350, chamber 300 can be RF powered to generate capacitively coupled etch plasma or inductively coupled etch plasma. The substrate 350 has a bevel edge 317 that includes a top and a bottom surface of the edge of the substrate, as shown in region B of FIG. 3 and enlarged region B in FIG. 3A. In FIG. 3A, bevel edge 317 is highlighted as a bold solid line and curve.

Surrounding the edge of substrate support 340, there is a bottom edge electrode 320, made of conductive materials, such as aluminum (Al). Between the substrate support 340 and the bottom edge electrode 320, there is a bottom dielectric ring 321 electrically separating the substrate support 340 and the bottom edge electrode 320. In one embodiment, substrate 350 is not in contact with the bottom edge electrode 320. Beyond the bottom edge electrode 320, there is another bottom insulating ring 325, which extends the surface of the bottom edge electrode 320 facing substrate 350.

Surrounding the gas delivery plate 360, there is a top edge electrode 310, made of conductive materials, such as aluminum (Al). The top edge electrode 310 is electrically insulated from the gas delivery plate 360 by a top dielectric ring 311. Beyond the top edge electrode 310, there is top insulating ring 315, which extends the surface of the top edge electrode 310 facing substrate 350.

In one embodiment, the bottom edge electrode 320 is coupled to an RF power source 323 and the top edge electrode 310 is grounded. During a substrate bevel edge treatment process, the RF power source 323 supplies RF power at a frequency between about 2 MHz to about 60 MHz and a power between about 100 watts to about 2000 watts to generate a treatment plasma. During bevel edge treatment the substrate support 340 and the gas delivery plate 360 are kept electrically floating. In another embodiment, the bottom electrode 340 is coupled to an RF power source 324. During a substrate bevel edge treatment process, the RF power source 324 supplies RF power at a frequency between about 2 MHz to about 60 MHz and a power between about 100 watts to about 2000 watts to generate a treatment plasma. During bevel edge treatment the gas delivery plate 360 is kept electrically floating, and both the bottom edge electrode 320 and the top edge electrode 310 are grounded.

The two embodiments of hardware configurations described above are merely examples, other configurations of bevel edge reactors can also be used. For details of other types of bevel edge reactors, see U.S. patent application Ser. No. 11/758,576, filed on Jun. 5, 2007, entitled "Edge Electrodes with Variable Power," U.S. patent application Ser. No. 11/758,584, filed on Jun. 5, 2007, entitled "Edge Electrodes with Dielectric Covers," U.S. patent application Ser. No. 11/440,561, filed on May 24, 2006, entitled "Apparatus and Methods to Remove Films on Bevel Edge and Backside of Wafer," U.S. patent application Ser. No. 11/355,458, filed on Feb. 15, 2006, entitled "Plasma Processing Reactor with Multiple Capacitive and Inductive Power Sources," and U.S. patent application Ser. No. 11/363,703, filed on Feb. 27, 2006, entitled "Integrated Capacitive and Inductive Power Sources for a Plasma Etching Chamber." The disclosure of each of the above-identified related applications is incorporated herein by reference.

The treatment plasma is configured to be confined by the top dielectric ring 311, top edge electrode 310, the top insulating ring 315, the bottom dielectric ring 321, the bottom edge electrode 320, and the bottom insulating ring. The treatment gas(es) is supplied through the gas feed 361. In one embodiment, the gas feed is located near the center of the gas delivery plate 360. Alternatively, the treatment gas(es) can also be supplied through gas feed(s) disposed in other parts of the process chamber 300, such as at the edge of chamber 300 through edge gas feeds 363, which are located near the bevel edge of substrate 350.

In one embodiment, the space between the top edge electrode 310 and the bottom edge electrode 320, $D_{EE}$, is less than 1.5 cm to ensure the plasma is confined. A $D_{EE}$ of less than 1.5 cm allows the ratio between the width ($D_W$) and gap ($D_{EE}$) of the opening near substrate edge to be less than 4:1, which ensures plasma confinement. $D_W$ is the width of the opening near the substrate edge. In one embodiment, $D_W$ is the width of the bottom insulating ring 325 or the width of the top insulating ring 315. The chamber pressure is kept between about 20 mTorr to about 100 Torr, and preferably between about 100 mTorr to about 2 Torr, during the bevel edge treatment process. The spacing between the gas delivery plate 360 and substrate 350, $D_S$, is less than 0.6 mm to ensure no plasma is formed between the gas delivery plate 360 and the substrate 350 during the bevel edge treatment process.

The embodiment of plasma chamber 300 shown in FIG. 3 is merely an example. Other embodiments of plasma chamber for bevel edge treatment are also possible. In another embodiment, the RF power supply can be coupled to the top edge electrode 310, while the bottom edge electrode 320 is grounded to generate the capacitively coupled treatment plasma. Alternatively, either the top edge electrode 310 or the bottom edge electrode 320 can be replaced with an inductive coil buried in a dielectric material. In this embodiment, the inductive coil is coupled to a RF power source and the opposing edge electrode is grounded. The RF power source supplies power to generate an inductively coupled etch plasma to treat the bevel edge 317. For further description of the plasma chamber see U.S. patent application Ser. No. (11/3,440,561), filed on May 24, 2006, entitled "Apparatus and Methods to Remove Films on the Bevel Edge and Backside of Wafer." The disclosure of the above-identified related applications is incorporated herein by reference.

The plasma generated near the substrate edge and between the top edge electrode 310 and the bottom edge electrode 320 treats the exposed copper at bevel edge and converts copper film at bevel edge to such as $CuO_E$, $CuO_XF_Y$, or $CuO_CCl_D$. In one embodiment, the treatment plasma gas source includes an oxygen-containing gas, such as $O_2$, $CO_2$, and $N_2O$. The oxygen-containing gas helps to convert copper film to an oxygen-containing compound, such as such as $CuO_E$, $CuO_XF_Y$, or $CuO_CCl_D$. The treatment gas source may also include a fluorine-containing, such as $NF_3$, $SF_6$, $C_2F_6$, or $CF_4$, or a chlorine-containing gas, such as $Cl_2$, or HCl. The fluorine-containing gas helps to convert copper film to a fluorine-containing compound, such as $CuO_XF_Y$. The chlorine-containing gas helps to convert copper film to a chlorine-containing compound, such as $CuO_CCl_D$. In one embodiment, the treatment gas is diluted by an inert gas, such as helium (He), argon (Ar), krypton (Kr), xenon (Xe), and radon (Ra).

For treatment plasma that includes only oxygen-containing gas, the process temperature is greater than 200° C. The chamber pressure is kept between about 20 mTorr to about 100 Torr, and preferably between about 100 mTorr to about 2 Torr, during the bevel edge treatment process. For treatment plasma that includes oxygen-containing gas and either a fluorine-containing gas or a chlorine-containing gas, the process temperature is between about 10° C. to about 50° C., preferably between about 15° C. to about 35° C. The plasma gas(es) can be fed through center gas feed 361 or edge gas feeds 363, or a combination of both gas feeds.

Figure 4A:
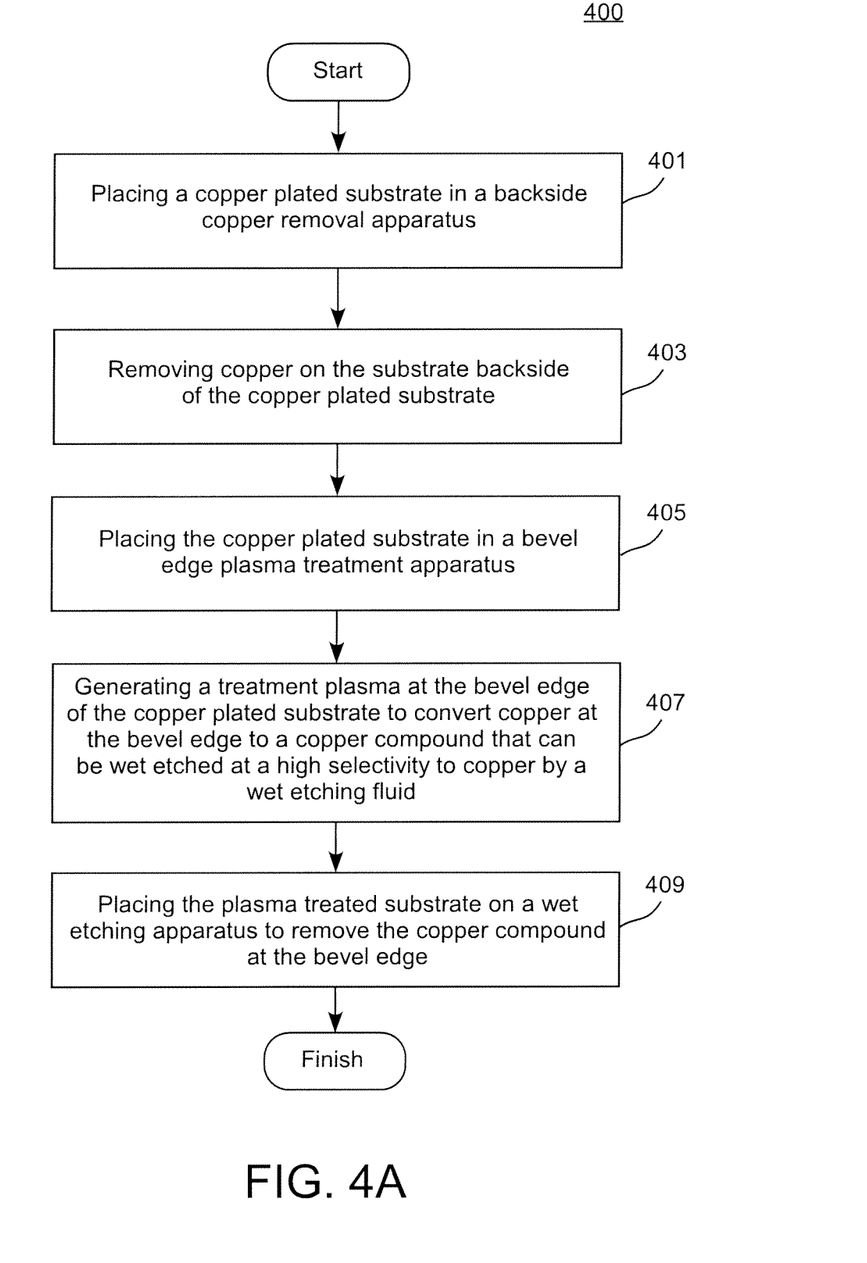
FIG. 4A show a process flow of removing copper at bevel edge, in accordance with one embodiment of the present invention.

As described above for FIG. 2A, the substrate needs to undergo an initial backside wet etch to remove backside copper prior to being sent to the plasma chamber 300 for plasma treatment. Afterwards, the substrate undergoes a plasma treatment to convert copper film near the bevel edge to Y material. Following the plasma treatment, the substrate is wet etched with chemical(s) that has high etch selectivity between the copper compound and copper. FIG. 4A shows a flow chart 400 of using the plasma treatment to assist removing copper film at the bevel edge. At step 401, a copper plated substrate is placed in a backside copper removal apparatus, such as the apparatus shown in FIG. 1B, to remove copper residue on the substrate backside. At step 403, the backside copper is removed. In one embodiment, a copper wet etching chemical is flown to the backside of the substrate. An inert gas is blown to the frontside of the substrate to prevent the copper wet etching chemical from reaching the substrate frontside. After the backside copper is removed, the substrate is rinsed and cleaned to removed the residual copper wet etching chemical from substrate surface.

After the backside copper is removed, the substrate is placed in a bevel edge plasma treatment chamber at step 405. At step 407, a treatment plasma is generated near the bevel edge to convert the copper film on the bevel edge to a copper compound that has a high wet etch selectivity to copper with a wet etch chemical for the copper compound. The plasma generated is only at the bevel edge. The bevel edge plasma treatment chamber is configured to limit the plasma to the area near bevel edge. The distance from the bevel edge of the substrate surface exposed to the treatment plasma can be controlled by the design of the reactor to be less than about 5 mm, preferably less than about 2 mm, and most preferably less than 1 mm. Since treatment process is a dry process, with proper hardware, it's possible to spatially control the bevel edge treatment to be equal to or less than 1 mm at a variation at about +/−0.1 mm. At step 409, the substrate is placed in a wet etching apparatus, such as a tank and is immersed in a wet etching fluid, containing a chemical that etches the converted copper compound, such as $CuO_E$, $CuO_XF_Y$, or $CuO_CCl_D$, with a high etch selectivity to copper. In one embodiment, the wet etch selectivity is greater than about 20, which means that the ratio of wet etch rate of material to wet etch rate of copper is about 20. In anther embodiment, the wet etch selectivity is between about 50 to about 100. The plasma treated copper compound at bevel edge is etched and the copper film on the substrate frontside remains unetched. In one embodiment, the wet etching fluid contains ammonium citrate. In another embodiment the wet etching fluid contains hydrogen fluoride (HF). In yet another embodiment, the wet etching fluid contains a nitric acid or a citric acid.

In the process described in FIG. 4A, the copper plated substrate is first removed of backside copper and plasma treated immediately after the backside copper removal. However, the plasma treatment of bevel edge copper and bevel edge copper compound removal by a wet etching fluid can be performed do not need to be performed immediately after backside copper removal. Bevel edge plasma treatment to convert copper to a copper compound, such as $CuO_E$, $CuO_XF_Y$, or $CuO_CCl_D$, and the removal of copper compound can be performed after other dielectric deposition and etching processes.

Alternatively, the copper compound, such as $CuO_E$, $CuO_XF_Y$, or $CuO_CCl_D$, can be removed by a plasma in a dedicated bevel edge plasma chamber similar to the one described in FIG. 3. Copper compound, such as $CuO_E$, $CuO_XF_Y$, or $CuO_CCl_D$, can be removed by $BCl_3$ with a carrier gas, such as argon (Ar), helium (He), or other types of inert gas. The processing temperature is between about 100° C. to about 300° C. The operating pressure is between about 20 mTorr to about 10 Torr.

Figure 4B:
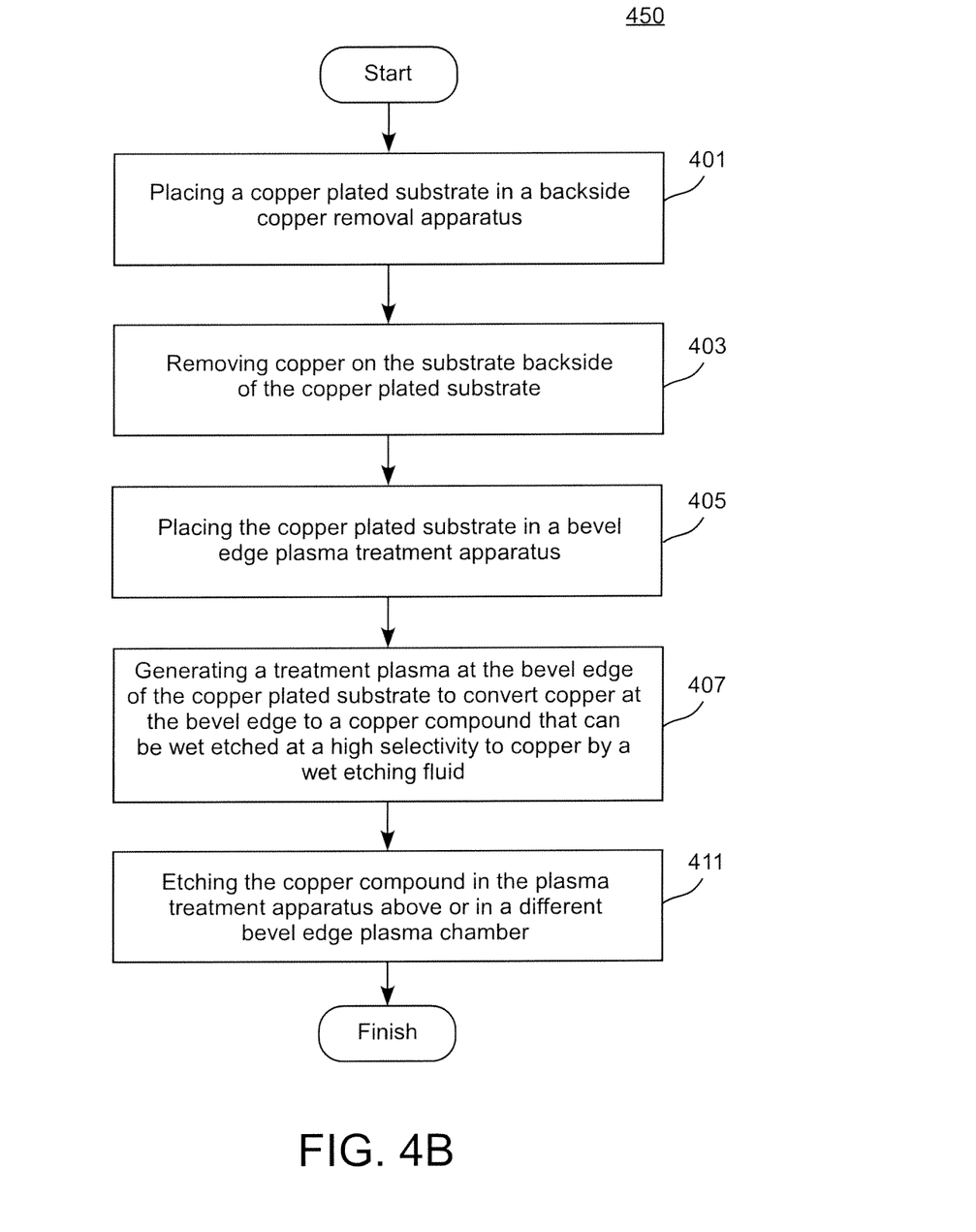
FIG. 4B show a process flow of removing copper at bevel edge, in accordance with another embodiment of the present invention.

FIG. 4B shows a process flow 450 of using a dedicated bevel edge plasma etching chamber. The process steps 401, 403, 405, 407 are similar to the process steps in FIG. 4A. After the copper film at the bevel edge has been converted to a copper compound, such as $CuO_E$, $CuO_XF_Y$, or $CuO_CCl_D$, at step 407, the substrate is etched in a bevel edge plasma chamber at step 411 to remove the copper compound, such as $CuO_E$, $CuO_XF_Y$, or $CuO_CCl_D$, by a bevel edge plasma, such as the process of $BCl_3$ with a carrier gas described above. The bevel edge plasma chamber can be the same one as the one used to convert copper to the copper compound in steps 405 and 407. Alternatively, the substrate with copper compound can be transferred to a different bevel edge plasma chamber to etch the copper compound. The bevel edge plasma chamber used to etch the copper compound has to be dedicated, due to the non-volatile nature of copper.

The concept of the invention can also be applied to any substrate with copper at the bevel edge. The substrate does not need to be plated with copper. For example, a substrate with a PVD or CVD copper seed layer can be removed of copper at the bevel edge by the apparatus and methods describe above.

The embodiments described above provides apparatus and methods of treating the bevel edge of a copper plated substrate to convert the copper at the bevel edge to a copper compound that can be wet etched with a fluid at a high etch selectivity in comparison to copper. Alternatively, the copper compound can be etched in a dedicated bevel edge plasma etching chamber. Either wet etch or dry etch of the copper compound allows the removal of the non-volatile copper in a wet etch processing chamber or a dedicated dry etching plasma chamber. The plasma treatment at bevel edge allows the copper at bevel edge to be removed at precise spatial control to 1 mm or below, such as 0.5 mm or 0.25 mm. In addition, the apparatus and methods described above for bevel edge copper removal do not have the problems of copper etching fluid being splashed on the device regions to cause defects and thinning of copper films.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of treating a copper film on a bevel edge of a substrate to convert the copper film to a copper compound to be removed by a wet etch, comprising:
   placing the substrate on a substrate support in the plasma treatment chamber;
   placing a plasma shield over the substrate, the plasma shield set to a separation of less than 0.6 mm from over the substrate when the substrate is present on the substrate support, a diameter of the plasma shield defining a mechanically controlled distance that leaves an edge of the substrate outside of the plasma shield;
   flowing a treatment gas through a gas feed that is embedded in a gas distribution plate of the plasma shield;
   generating a treatment plasma near the bevel edge of the substrate and outside of the plasma shield to convert the copper film on the bevel edge of the substrate to a copper compound, the generated treatment plasma converts the copper film in a region that is equal to or less than about 1 mm from the bevel edge with a variation at about +/−0.1 mm; and
   placing the substrate in a wet etching apparatus with a wet etching fluid to remove the copper compound on the bevel edge, the wet etching fluid having a wet etch selectivity that is greater than about 20:1 to the copper film away from the bevel edge that has been exposed to the treatment plasma, wherein the copper compound is one of a group consisting of $CuO_E$, $CuO_XF_Y$, or $CuO_CCl_D$, and wherein E, X, Y, C and D are numbers.

2. The method of claim 1, wherein the treatment gas includes an oxygen-containing gas, and either a fluorine-containing or a chlorine-containing gas.

3. The method of claim 1, wherein the wet etching fluid includes an etchant selected from a group consisting of ammonium citrate, hydrogen fluoride, a nitric acid, or a citric acid.

4. The method of claim 1, wherein the substrate has a barrier layer, a copper seed layer over the barrier layer, and a plated copper layer over the copper seed layer, the copper film including both the copper seed layer and the plated copper layer.

5. The method of claim 1, further comprising:
removing the copper film on a backside of the substrate prior to placing the substrate in the plasma treatment chamber.

6. The method of claim 1, wherein the treatment plasma near the bevel edge is capactiviely or inductively generated by a bottom edge electrode surrounding the substrate support in the plasma treatment chamber and a top edge electrode surrounding a gas delivery plate opposing the substrate support.

7. The method of claim 6, wherein a distance between the top edge electrode and the bottom edge electrode is less than about 1.5 cm to confine the treatment plasma.

8. The method of claim 1, the treatment gas is delivered to the plasma treatment chamber by a gas feed disposed near a center of the substrate, near the bevel edge of the substrate, or near the center of the substrate with an additional gas feed near the bevel edge of the substrate.

9. The method of claim 1, wherein the wet etch selectivity is up to about 100:1.

10. A method of treating a copper film on a bevel edge of a substrate, comprising:
placing the substrate on a substrate support in a plasma treatment chamber having a bottom edge electrode surrounding and isolated from the substrate support and a top electrode surrounding and isolated from a plasma shield;
orienting the plasma shield over the substrate, the plasma shield set to a separation of about less than 0.6 mm over the substrate when the substrate is present on the substrate support, a diameter of the plasma shield defining a mechanically controlled distance that leaves the bevel edge of the substrate outside of the plasma in a region that is where the top edge electrode and bottom edge electrode face each other, and the plasma shield acts to protect a center of the substrate from etching when disposed under the plasma shield;
flowing a treatment gas through a gas feed that is embedded in a gas distribution plate of the plasma shield;
generating a treatment plasma near the bevel edge of the substrate and outside of the plasma shield using the top and bottom edge electrodes to convert the copper film on the bevel edge of the substrate to a copper compound, the generated treatment plasma converts the copper film in a region that is equal to or less than about 2 mm from the bevel edge; and
moving the substrate from the plasma treatment chamber to a wet etching apparatus;
in the wet etching apparatus, applying a wet etching fluid to remove the copper compound on the bevel edge, the wet etching fluid having a wet etch selectivity that is greater than about 20:1 to the copper film away from the bevel edge that has been exposed to the treatment plasma, wherein the copper compound is one of a group consisting of $CuO_E$, $CuO_XF_Y$, or $CuO_CCl_D$, and wherein E, X, Y, C and D are numbers.

11. The method of claim 10, setting a distance between the top edge electrode and the bottom edge electrode to be about 1.5 cm or less to confine the treatment plasma.

12. The method of claim 10, wherein the treatment gas is delivered to the plasma treatment chamber by a gas feed of the gas distribution plate that is disposed near a center of the substrate.

13. The method of claim 10, wherein the treatment gas is delivered to the plasma treatment chamber by a gas feed of the gas distribution plate that is disposed near the bevel edge of the substrate.

14. The method of claim 10, wherein the wet etch selectivity is up to about 100:1

* * * * *